United States Patent
Chen (10) Patent No.: US 11,245,360 B2
(45) Date of Patent: Feb. 8, 2022

(54) OSCILLATOR CIRCUIT, CHIP AND ELECTRONIC DEVICE

(71) Applicant: Shenzhen Goodix Technology Co., Ltd., Shenzhen (CN)

(72) Inventor: Jianxing Chen, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/107,840

(22) Filed: Nov. 30, 2020

(65) Prior Publication Data
US 2021/0152124 A1    May 20, 2021

Related U.S. Application Data (63) Continuation of application No. PCT/CN2019/119486, filed on Nov. 19, 2019.

(51) Int. Cl.
*H03B 5/24*     (2006.01)
*H03K 3/037*    (2006.01)
(Continued)

(52) U.S. Cl.
CPC .............. *H03B 5/24* (2013.01); *H03B 5/30* (2013.01); *H03K 3/0231* (2013.01); *H03K 3/037* (2013.01); *H03K 5/24* (2013.01)

(58) Field of Classification Search
CPC ........ H03K 3/037; H03K 5/24; H03K 3/0231; H03B 5/30; H03B 5/24
(Continued)

(56) References Cited

U.S. PATENT DOCUMENTS

2010/0007387 A1    1/2010  Chang
2013/0038364 A1    2/2013  Tokairin
(Continued)

FOREIGN PATENT DOCUMENTS

CN    102158203 A    8/2011
CN    102324912 A    1/2012
(Continued)

OTHER PUBLICATIONS

Shenzhen Goodix Technology Co., Ltd., PCT International Search Report, PCT/CN2019/119486, dated Aug. 26, 2020, 5 pages.
(Continued)

*Primary Examiner* — Arnold M Kinkead
(74) *Attorney, Agent, or Firm* — USCH Law, PC (57) ABSTRACT

The present disclosure provides an oscillator circuit, a chip and an electronic device. The oscillator circuit includes two charge and discharge circuits, a reference voltage switching module, two comparators and a logic control module. When an output of either of the comparators, the logic control module controls one charge and discharge circuit connected to the comparator to discharge, controls the other charge and discharge circuit to charge, and controls the reference voltage switching module to switch a reference voltage of the comparator to a second voltage. When the output of the comparator transitions back, the logic control module controls the one charge and discharge circuit to charge. When the output of the comparator transitions again, the logic control module controls the reference voltage switching module to switch the reference voltage of the comparator to a first voltage, and controls one charge and discharge circuit to stop charging.

17 Claims, 7 Drawing Sheets

(51) Int. Cl.
  *H03K 5/24* (2006.01)
  *H03B 5/30* (2006.01)
  *H03K 3/0231* (2006.01)

(58) Field of Classification Search
  USPC .................................................. 331/111, 143
  See application file for complete search history.

(56) References Cited

U.S. PATENT DOCUMENTS

2014/0176250 A1* 6/2014 Thomsen ............. H03K 3/0231
  331/143
2018/0062626 A1* 3/2018 Hunter ..................... H03B 5/24

FOREIGN PATENT DOCUMENTS

| CN | 105071786 A | 11/2015 |
| CN | 103546123 B | 12/2015 |
| CN | 108964610 A | 12/2018 |
| CN | 111108684 A | 5/2020 |
| JP | 2002140131 A | 5/2002 |

OTHER PUBLICATIONS

Shenzhen Goodix Technology Co., Ltd., Extended European Search Report, EP19929186.5, dated Jun. 1, 2021, 8 pgs.

* cited by examiner

FIG. 1

(PRIOR ART)

OSCILLATOR CIRCUIT, CHIP AND
ELECTRONIC DEVICE

CROSS REFERENCE TO RELATED
APPLICATIONS

The present application is a continuation of PCT Patent Application No. PCT/CN2019/119486, filed Nov. 19, 2019, which is incorporated herein by reference in its entirety.

TECHNICAL FIELD

The present disclosure relates to circuit design technology, and in particular, to an oscillator circuit, a chip and an electronic device.

BACKGROUND

An oscillator circuit refers to a circuit that may generate an oscillation current, which is widely used in the electronic technology at present. For example, the oscillator circuit may be integrated in an integrated circuit and serve as an oscillation source for generating a clock signal.

SUMMARY

An objective of some embodiments of the present disclosure is to provide an oscillator circuit, a chip and an electronic device, which switch and control a reference voltage of a comparator, and eliminates a delay time that affects the accuracy of the oscillator circuit by subtracting delay times of the comparator at different reference voltages from each other, thus improving the accuracy of the oscillator circuit.

An embodiment of the present disclosure provides an oscillator circuit, including: a first charge and discharge circuit, a second charge and discharge circuit, a reference voltage switching module, a first comparator, a second comparator and a logic control module. The first charge and discharge circuit is connected to a first input terminal of the first comparator, the second charge and discharge circuit is connected to a first input terminal of the second comparator, the reference voltage switching module is connected to a second input terminal of the first comparator and connected to a second input terminal of the second comparator, and an output terminal of the first comparator and an output terminal of the second comparator are respectively connected to the logic control module. The logic control module is configured to control the first charge and discharge circuit to start discharging when an output of the first comparator whose reference voltage is a first voltage transitions, control the second charge and discharge circuit to start charging and control the reference voltage switching module to switch a reference voltage of the first comparator to a second voltage. The logic control module is further configured to control the first charge and discharge circuit to start charging when the output of the first comparator transitions again. The logic control module is further configured to control the reference voltage switching module to switch the reference voltage of the first comparator to the first voltage and control the first charge and discharge circuit to stop charging when the output of the first comparator transitions again. The logic control module is further configured to control the second charge and discharge circuit to start discharging, control the first charge and discharge circuit to start charging and control the reference voltage switching module to switch a reference voltage of the second comparator to a second voltage when an output of the second comparator whose reference voltage is the first voltage transitions. The logic control module is further configured to control the second charge and discharge circuit to start charging when the output of the second comparator transitions again. The logic control module is further configured to control the reference voltage switching module to switch the reference voltage of the second comparator to the first voltage and control the second charge and discharge circuit to stop charging when the output of the second comparator transitions again.

An embodiment of the present disclosure further provides a chip, which includes the above oscillator circuit.

An embodiment of the present disclosure further provides an electronic device, which includes the above chip.

Compared with existing technologies, the logic control module may control the first charge and discharge circuit connected to the first comparator to start discharging when the output of the first comparator whose reference voltage is the first voltage transitions, control the second charge and discharge circuit to start charging, and control the reference voltage switching module to switch the reference voltage of the first comparator to the second voltage according to the embodiments of the present disclosure. When the output of the first comparator transitions again, the first charge and discharge circuit connected to the first comparator is controlled to charge. When the output of the first comparator transitions again, the reference voltage switching module is controlled to switch the reference voltage of the first comparator to the first voltage, and the first charge and discharge circuit is controlled to stop charging. When the output of the second comparator transitions, the similar operation is repeated. In the present disclosure, the reference voltage of the comparator is switched and controlled, and the delay time that affects the accuracy in the oscillator circuit is eliminated by subtracting delay times of the comparator at different reference voltages from each other, thus improving the accuracy of the oscillator circuit.

In an example, the reference voltage switching module includes: a reference voltage generating circuit and a reference voltage control circuit. Two output terminals of the reference voltage generating circuit are respectively connected to two input terminals of the reference voltage control circuit. Two output terminals of the reference voltage control circuit are respectively connected to the second input terminal of the first comparator and the second input terminal of the second comparator. The reference voltage generating circuit is configured to generate the first voltage and the second voltage, and output the first voltage and the second voltage to the reference voltage control circuit. The logic control module is configured to control the reference voltage control circuit to switch the reference voltage of the first comparator and the reference voltage of the second comparator. The present embodiment provides a specific implementation of the reference voltage switching module.

In an example, the first charge and discharge circuit has the same structure as the second charge and discharge circuit. Each of the first charge and discharge circuit and the second charge and discharge circuit includes: a current control module and a charging capacitor. A first terminal of the current control module is configured to connect to a voltage source, a second terminal of the current control module is connected to a first terminal of the charging capacitor, and a second terminal of the charging capacitor is grounded. A connection between the current control module and the charging capacitor in the first charge and discharge circuit is connected to the first input terminal of the first comparator. A connection between the current control module and the charging capacitor in the second charge and discharge circuit is connected to the first input terminal of the second comparator. The present embodiment provides a specific implementation of the charge and discharge circuit.

In an example, the reference voltage generating circuit includes: a current control module, a first resistor and a second resistor connected in sequence. A first terminal of the current control module is configured to connect to a voltage source, a second terminal of the current control module and a first terminal of the second resistor are respectively connected to two terminals of the first resistor, and a second terminal of the second resistor is grounded. The two terminals of the first resistor form the two output terminals of the reference voltage generating circuit. The present embodiment provides a specific implementation of the reference voltage generation circuit.

In an example, the current control module is a resistor or a current source.

In an example, each of the first charge and discharge circuit and the second charge and discharge circuit further includes a first switch module and a second switch module. The first terminal of the current control module is configured to connect to the voltage source through the first switch module. The connection between the current control module and the charging capacitor in each of the first charge and discharge circuit and the second charge and discharge circuit is grounded through the second switch module. The logic control module is further connected to a control terminal of the first switch module and a control terminal of the second switch module respectively. The logic control module is configured to control the charge and discharge circuit to start charging by controlling the first switch module in the charge and discharge circuit to be turned on and the second switch module to be turned off. The logic control module is configured to control the charge and discharge circuit to start discharging by controlling the first switch module to be turned off and the second switch module to be turned on. The present embodiment provides a specific way to control the charging and discharging of the charge and discharge circuit.

In an example, the logic control module is configured to control the first charge and discharge circuit and the second charge and discharge circuit to start charging respectively when the oscillator circuit starts working, and control the second charge and discharge circuit to stop charging when a voltage across two terminals of the charging capacitor in the second charge and discharge circuit reaches the first voltage. The present embodiment provides a specific control mode when the oscillator circuit starts working.

In an example, a duration of one cycle of the oscillator circuit is twice a duration of charging the charging capacitor from the first voltage to the second voltage.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

In order to make objectives, technical solutions and advantages of the present disclosure clearer, some embodiments of the present disclosure will be explained below in detail with reference to accompanying drawings and embodiments. It should be understood that specific embodiments described here only explain the disclosure but do not constitute a limitation to the disclosure.

Figure 1:
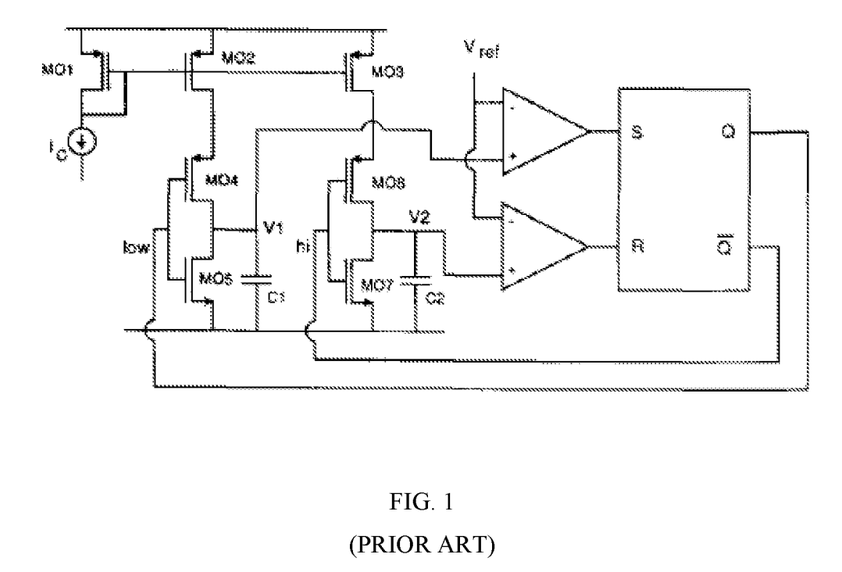
FIG. 1 is a circuit diagram of a conventional double capacitor oscillator circuit.

Please refer to FIG. 1, which is a conventional double capacitor oscillator circuit. A MOS transistor MO2 and a MOS transistor MO3 mirror a current $I_c$ of a MOS transistor MO1, and reference voltages of two comparators are both $V_{ref}$. Assuming that an output terminal Q of a RS trigger is at a low level and an output terminal $\overline{Q}$ is at a high level in an initial state, at this time, a MOS transistor MO4 is turned on, a MOS transistor MO5 is turned off, and the current $I_c$ charges a capacitor C1. In addition, a MOS transistor MO7 is turned on, a MOS transistor MO8 is turned off, and a capacitor C2 is discharged. When a voltage V1 across both terminals of the capacitor C1 rises above a reference voltage $V_{ref}$ of a comparator 100, an output of the comparator 100 is flipped. An input at an input terminal S of the RS trigger changes to the high level, an output at the output terminal Q changes from the low level to the high level, and an output at the output terminal $\overline{Q}$ changes from the high level to the low level. At this time, the capacitor C1 starts discharging and the capacitor C2 starts charging. When a voltage V2 across both terminals of the capacitor C2 rises above a reference voltage $V_{ref}$ of a comparator 200, an output of the comparator 200 is flipped. The input at the input terminal R of the RS trigger changes to the high level, the output at the output terminal Q changes from the high level to the low level, and the output at the output terminal $\overline{Q}$ changes from the low level to the high level. Then the above process is repeated and cycled.

It may be seen from the above that the above-mentioned double capacitor oscillator circuit may achieve a duty ratio of 50% under a condition of C1=C2, and may achieve a higher accuracy at the same time. Assuming C1=C2=C, an expression of a circle length of the double capacitor oscillator circuit may be obtained:

$$T = 2 * \left( \frac{V_{ref} * C}{I_c} + T_d \right)$$

Due to the existence of a delay time T between the comparator and the RS trigger, and the $T_d$ may change with the changes of a voltage, a temperature and a process, which limits the highest accuracy of the double capacitor oscillator circuit. It is generally necessary to consume a larger current to achieve a smaller $T_d$. Based on this, the inventor proposed the technical solution of the present disclosure.

Figure 2:
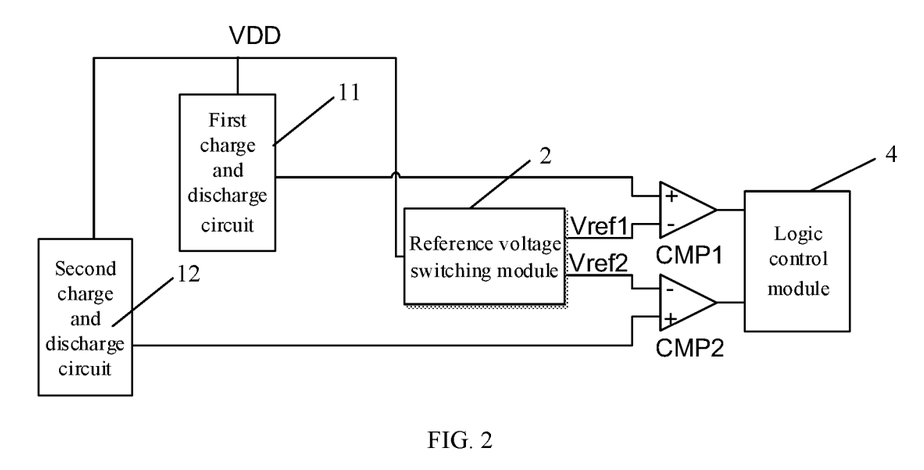
FIG. 2 is a circuit diagram of an oscillator circuit according to a first embodiment of the present disclosure.

A first embodiment of the present disclosure relates to an oscillator circuit, which is applied to a chip in an electronic device. Referring to FIG. 2, the oscillator circuit includes: two charge and discharge circuits, a reference voltage switching module 2, two comparators and a logic control module 4. The two charge and discharge circuits are respectively a first charge and discharge circuit 11 and a second charge and discharge circuit 12, and the two comparators are respectively a first comparator CMP1 and a second comparator CMP2.

The first charge and discharge circuit 11, the second charge and discharge circuit 12, and the reference voltage switching module 2 are respectively connected to a voltage source VDD. The first charge and discharge circuit 11 is connected to a first input terminal of the first comparator CMP1, that is, to a positive input terminal of the first comparator CMP1. The second charge and discharge circuit 12 is connected to a first input terminal of the second comparator CMP2, that is, to a positive input terminal of the second comparator CMP2. The reference voltage switching module 2 is connected to a second input terminal of each of the two comparators respectively, that is, to a negative input terminal of the first comparator CMP1 and a negative input terminal of the second comparator CMP2. The output terminals of the first comparator CMP1 and the second comparator CMP2 are respectively connected to the logic control module 4. The logic control module 4 is further connected to the two charge and discharge circuits and the reference voltage switching module 2 (not shown in the figure).

The reference voltage switching module 2 is configured to output a reference voltage Vref1 to the first comparator CMP1 and a reference voltage Vref2 to the second comparator CMP2, that is, the reference voltage switching module 2 may control the reference voltages of both the first comparator CMP1 and the second comparator CMP2.

The logic control module 4 is configured to control one charge and discharge circuit connected to either of the comparators to start discharging when the output of the comparator whose reference voltage is a first voltage transitions, control the other charge and discharge circuit to start charging, and control the reference voltage switching module 2 to switch the reference voltage of the comparator to a second voltage.

The logic control module 4 is further configured to control the one charge and discharge circuit to start charging when the output of the corresponding comparator transitions again.

The logic control module 4 is further configured to control the reference voltage switching module to switch the reference voltage of the comparator to the first voltage when the output of the comparator transitions again, and control the one charge and discharge circuit to stop charging.

In an example, the first charge and discharge circuit 11 has the same structure as the second charge and discharge circuit 12. Each of the two charge and discharge circuits includes: a current control module and a charging capacitor. A first terminal of the current control module is configured to connect to a voltage source, a second terminal of the current control module is connected to a first terminal of the charging capacitor, and a second terminal of the charging capacitor is grounded. A connection between the current control module and the charging capacitor in the first charge and discharge circuit 11 is connected to the first input terminal of the first comparator CMP1. A connection between the current control module and the charging capacitor in the second charge and discharge circuit 12 is connected to the first input terminal of the second comparator CMP2.

Figure 3:
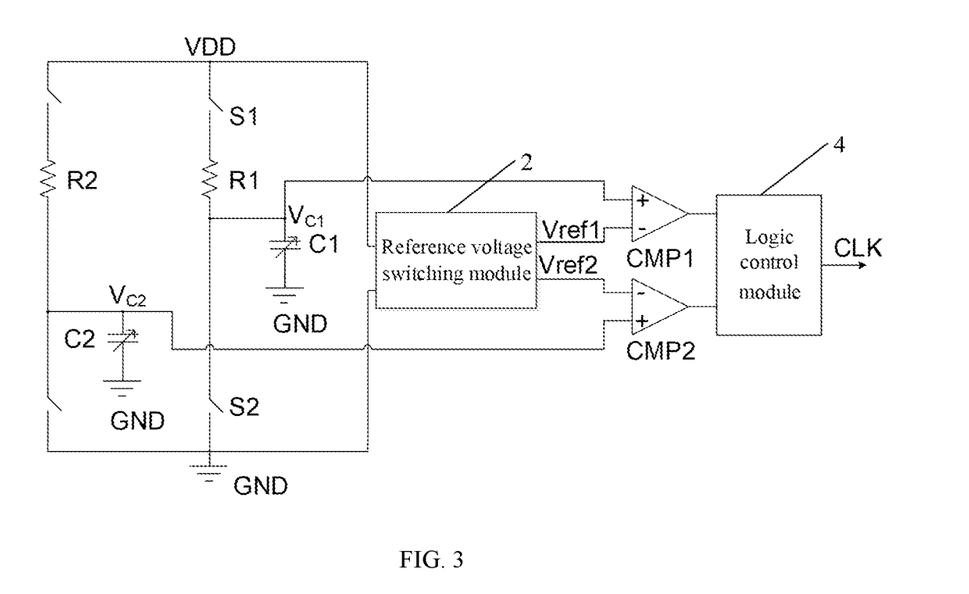
FIG. 3 is a circuit diagram of the oscillator circuit according to the first embodiment of the present disclosure, in which a current control module in a charge and discharge circuit is a resistor.

This embodiment exemplifies a resistor as the current control module, referring to FIG. 3, the first charge and discharge circuit 11 includes a resistor R1 and a capacitor C1, and the second charge and discharge circuit 12 includes a resistor R2 and a capacitor C2. It should be noted that in this embodiment, resistance values of the resistor R1 and the resistor R2 are generally set to be equal, and capacitance values of the capacitor C1 and the capacitor C2 are generally set to be equal.

A first terminal of the resistor R1 and a first terminal of the resistor R2 are respectively connected to the voltage source VDD. A second terminal of the resistor R1 is connected to a first terminal of the capacitor C1, and a second terminal of the capacitor C1 is grounded to GND. A connection between the resistor R1 and the capacitor C1 is connected to a positive input terminal of the first comparator CMP1. A second terminal of the resistor R2 is connected to a first terminal of the capacitor C2, and a second terminal of the capacitor C2 is grounded to GND. A connection between the resistor R2 and the capacitor C2 is connected to a positive input terminal of the second comparator CMP2.

The reference voltages of both the first comparator CMP1 and the second comparator CMP2 are a first voltage $V_h$, and an initial state is that the capacitor C1 is charged to the first voltage $V_h$ and the capacitor C2 is charged to a second voltage $V_1$, which are taken as an example to be specifically described below:

Sine there is a delay time $T_d$ between the logic control module 4 and each of both the first comparator CMP1 and the second comparator CMP2, the capacitor is actually charged to $V_h+V_d$ after the delay time $T_d$ (where $V_d$ represents a charging voltage difference caused by $T_d$) when the capacitor in the oscillator circuit is charged to the first voltage $V_h$. Similarly, when the capacitor is charged to the second voltage $V_1$, the capacitor is actually charged to $V_1+V_d$.

A first cycle of the oscillator circuit is taken as an example.

When the oscillator circuit starts working, the logic control module 4 controls the first charge and discharge circuit 11 and the second charge and discharge circuit 12 to start charging respectively, that is, controls the voltage source VDD to start charging the capacitor C1 and the capacitor C2 respectively, and controls the second charge and discharge circuit to stop charging when a voltage across both terminals of the capacitor C2 reaches the second voltage $V_1$, that is, to stop charging the capacitor C2 when the voltage across both terminals of the capacitor C2 reaches the second voltage $V_1$. At this time, the voltage $V_{C2}$ across both terminals of the capacitor C2 is actually $V_1+V_d$. At this time, the oscillator circuit reaches the initial state and enters a first half cycle of the first cycle.

In the first half cycle, when the capacitor C1 is charged to the first voltage $V_h$, the output of the first comparator CMP1 transitions from a low level to a high level, and the voltage $V_{C1}$ across both terminals of the capacitor C1 is actually $V_h+V_d$. The logic control module 4 controls the capacitor C1 in the first charge and discharge circuit 11 connected to the first comparator CMP1 to start discharging, and controls the capacitor C2 in the second charge and discharge circuit 12 to start charging, while controlling the reference voltage switching module 2 to switch the reference voltage of the first comparator CMP1 to the second voltage $V_1$. The capacitor C1 starts discharging from $V_h+V_d$. When the voltage $V_{C1}$ across both terminals of the capacitor C1 is lower than the second voltage $V_1$, the output of the first comparator CMP1 transitions from a high level to a low level. Due to the existence of the delay time $V_d$, the voltage $V_{C1}$ across both terminals of the capacitor C1 is actually $V_1-V_d'$ (where $V_d'$ represents a discharging voltage difference caused by $T_d$), and the voltage source VDD is controlled to charge the capacitor C1. When the capacitor C1 is charged to the second voltage $V_1$, the output of the first comparator CMP1 transitions from a low level to a high level again. The logic control module 4 controls the reference voltage switching module 2 to switch the reference voltage of the first comparator CMP1 to the first voltage $V_h$, and controls the voltage source VDD to stop charging the capacitor C1, and the voltage across both terminals of the capacitor C1 is $V_1+V_d$. In the first half cycle, the capacitor C2 is always in a charging state. Since the reference voltage of the second comparator CMP2 is the first voltage $V_h$, the output of the second comparator CMP2 is always at a low level.

In a second half cycle, when the capacitor C2 is charged to the first voltage $V_h$, the output of the second comparator CMP2 transitions from a low level to a high level, and the voltage $V_{C2}$ across both terminals of the capacitor C2 is actually $V_h+V_d$. The logic control module 4 controls the capacitor C2 in the second charge and discharge circuit 12 connected to the second comparator CMP2 to start discharging, and controls the capacitor C1 in the first charge and discharge circuit 11 to start charging, while controlling the reference voltage switching module 2 to switch the reference voltage of the second comparator CMP2 to the second voltage $V_1$. The capacitor C2 starts discharging from $V_h+V_d$. When the voltage $V_{C2}$ across both terminals of the capacitor C2 is lower than the second voltage $V_1$, the output of the second comparator CMP2 transitions from a high level to a low level. Due to the existence of the delay time $V_d$, the voltage $V_{C2}$ across both terminals of the capacitor C2 is actually $V_1-V_d'$ (where $V_d'$ represents the discharging voltage difference caused by T), and the voltage source VDD is controlled to charge the capacitor C2. When the capacitor C2 is charged to the second voltage $V_1$, the output of the second comparator CMP2 transitions from a low level to a high level again. The logic control module 4 controls the reference voltage switching module 2 to switch the reference voltage of the second comparator CMP2 to the first voltage $V_h$, and controls the voltage source VDD to stop charging the capacitor C2. The voltage $V_{C2}$ across both terminals of the capacitor C2 is $V_1+V_d$. In the second half cycle, the capacitor C1 is always in the charging state. Since the reference voltage of the first comparator CMP1 is the first voltage $V_h$, the output of the first comparator CMP1 is always at the low level.

Figure 4:
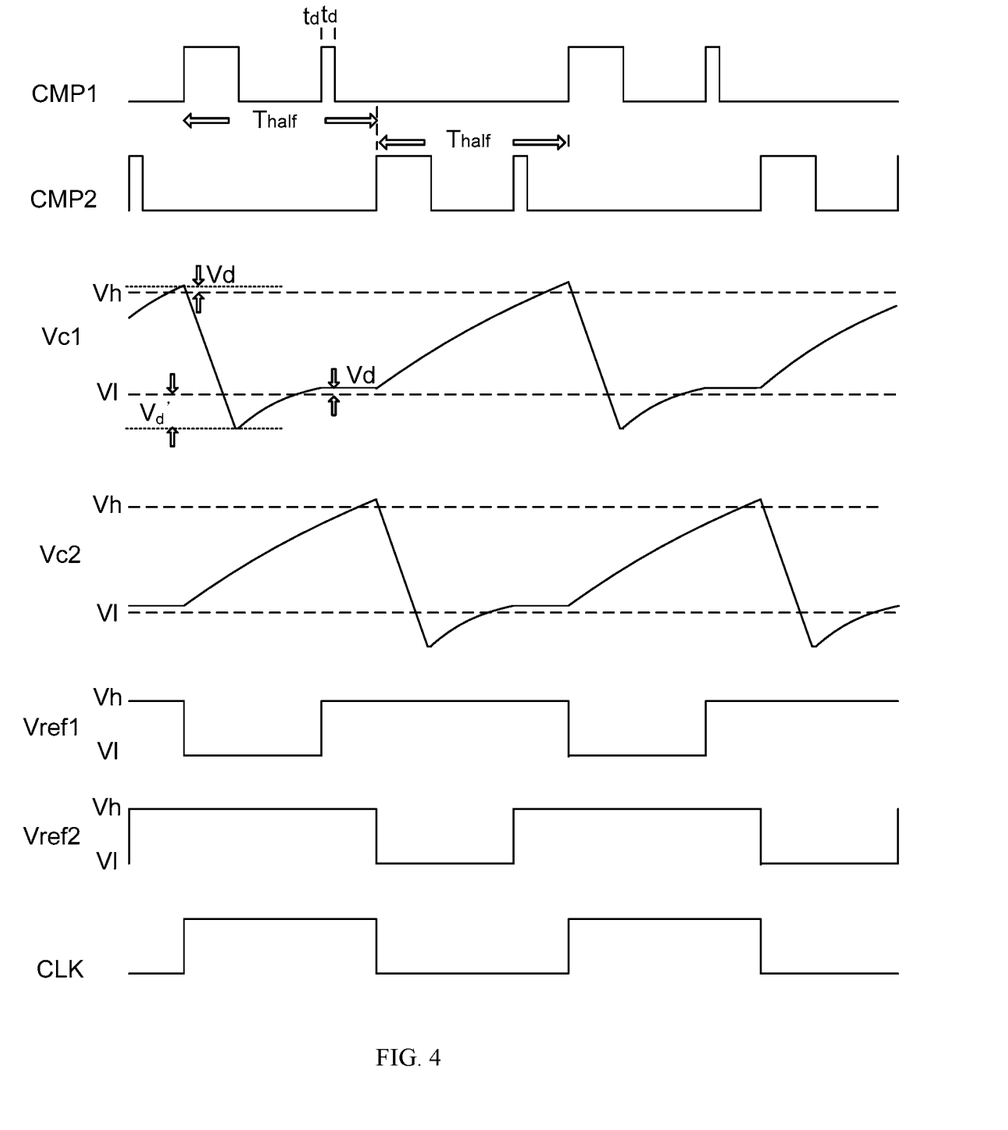
FIG. 4 is a timing diagram of the oscillator circuit in FIG. 3 according to the first embodiment of the present disclosure.

Referring to FIG. 4, which is a timing diagram of the oscillator circuit in FIG. 3, Vref1 represents the reference voltage of the first comparator CMP1, and Vref2 represents the reference voltage of the second comparator CMP2.

In an example, each of the first charge and discharge circuit and the second charge discharge circuit further includes a first switch module S1 and a second switch module S2. The first terminal of the current control module is connected to the voltage source VDD through the first switch module S1. The connection between the current control module and the charging capacitor in each of the first charge and discharge circuit and the second charge discharge circuit is grounded through the second switch module S2. The logic control module 4 is further connected to a control terminal of the first switch module S1 and a control terminal of the second switch module S2 respectively.

The logic control module 4 is configured to control the charge and discharge circuit to start charging by controlling the first switch module S1 to be turned on and the second switch module S2 to be turned off in the charge and discharge circuit. Taking the first charge and discharge circuit 11 as an example, the logic control module 4 controls the first charge and discharge circuit 11 to start charging by controlling the first switching module S1 to be turned on and the second switching module S2 to be turned off in the first charge and discharge circuit 11.

The logic control module 4 is configured to control the charge and discharge circuit to start discharging by controlling the first switch module S1 to be turned off and the second switch module S2 to be turned on in the charge and discharge circuit. Taking the first charge and discharge circuit 11 as an example, the logic control module 4 controls the first charge and discharge circuit 11 to start discharging by controlling the first switching module S1 to be turned off and the second switching module S2 to be turned on in the first charge and discharge circuit 11.

In FIG. 3, the logic control module 4 controls the voltage source VDD to charge the capacitor C1 by controlling the first switch module S1 to be turned on and the second switch module S2 to be turned off in the first charge and discharge circuit 11. The logic control module 4 controls the capacitor C1 to discharge by controlling the first switch module S1 to be turn off and the second switch module S2 to be turned on in the first charge and discharge circuit 11. The way in which the logic control module 4 controls the charging and discharging of the capacitor C2 is similar to the above, and will not be repeated here.

In this embodiment, in the case of C1=C2=C, a duty ratio of an output clock signal CLK of the logic control module 4 is 50%. It may be seen from the above that a duration of a half cycle is a duration in which the capacitor C1 or C2 is charged from the voltage $V_1+V_d$ to $V_h+V_d$, then the duration of the half cycle $$T_{half} = T_{Vh} + T_d - (T_{V1} + T_d) = T_{Vh} - T_{V1} = RC * \ln\frac{VDD-V1}{VDD-Vh}.$$

Herein, $T_{Vh}$ is a time in which the capacitor is charged from 0 to the first voltage $V_h$, $T_{V1}$ is a time in which the capacitor is charged from 0 to the second voltage $V_1$, R represents a resistance value of the resistor in the charge and discharge circuit, and C represents a capacitance value of the capacitor C1 or C2.

It may be seen from the expression of $T_{half}$ that the cycle length of the oscillator circuit in this embodiment has nothing to do with the delay time $T_d$ between the comparator and the logic control module 4, that is, an error source (i.e., the delay time $T_d$) that limits the accuracy of the oscillator circuit is eliminated, so that compared with the double capacitor oscillator circuit in FIG. 1, a higher accuracy may be achieved under the same current.

Compared with existing technologies, the logic control module may control the first charge and discharge circuit connected to the first comparator to start discharging when the output of the first comparator whose reference voltage is the first voltage transitions, control the second charge and discharge circuit to start charging, and control the reference voltage switching module to switch the reference voltage of the first comparator to the second voltage according to the embodiment. When the output of the first comparator transitions again, the first charge and discharge circuit connected to the first comparator is controlled to charge. When the output of the first comparator transitions again, the reference voltage switching module is controlled to switch the reference voltage of the first comparator to the first voltage, and the first charge and discharge circuit is controlled to stop charging. When the output of the second comparator transitions, the similar operation is repeated. In the present disclosure, the reference voltage of the comparator is switched and controlled, and the delay time that affects the accuracy in the oscillator circuit is eliminated by subtracting delay times of the comparator at different reference voltages from each other, thus improving the accuracy of the oscillator circuit.

Figure 5:
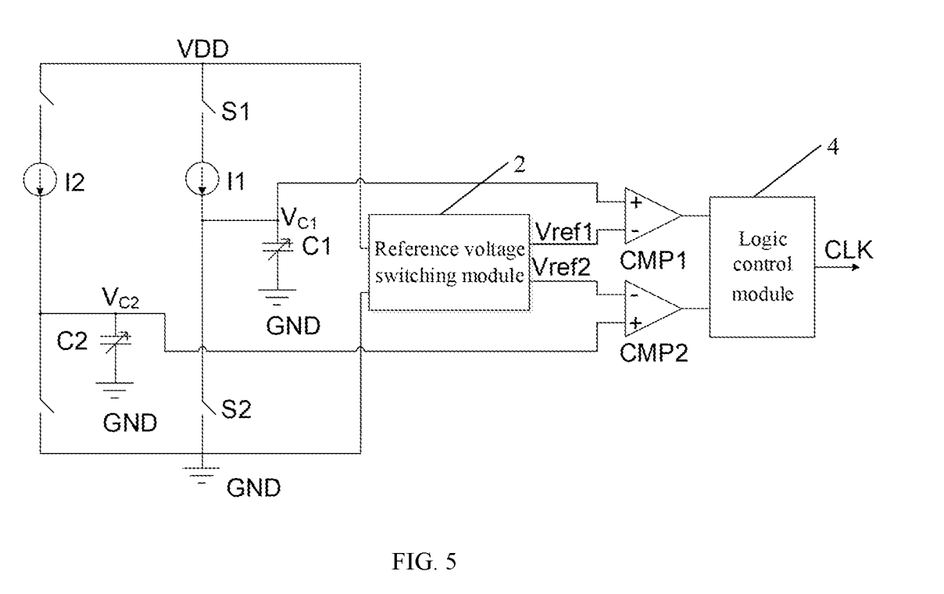
FIG. 5 is a circuit diagram of an oscillator circuit according to a second embodiment of the present disclosure, in which a current control module in a charge and discharge circuit is a current source.

A second embodiment of the present disclosure relates to an oscillator circuit. Compared with the first embodiment, a main difference of this embodiment is that a current control module in a charge and discharge circuit is a current source.

Referring to FIG. 5, a first charge and discharge circuit 11 includes a current source I1 and a capacitor C1, and a second charge and discharge circuit 12 includes a current source 12 and a capacitor C2. It should be noted that in this embodiment, currents of the current source I1 and the current source 12 are generally set to be equal, and capacitance values of the capacitor C1 and the capacitor C2 are generally set to be equal.

A first terminal of the current source I1 and a first terminal of the current source 12 are respectively connected to a voltage source VDD. A second terminal of the current source I1 is connected to a first terminal of the capacitor C1, a second terminal of the capacitor C1 is grounded, and a connection between the current source I1 and the capacitor C1 is connected to a positive input terminal of a first comparator CMP1. A second terminal of the current source 12 is connected to a first terminal of the capacitor C2, a second terminal of the capacitor C2 is grounded, and a connection between the current source 12 and the capacitor C2 is connected to a positive input terminal of a second comparator CMP2. It should be noted that each of the two charge and discharge circuits further including a first switch module S1 and a second switch module S2 is taken as an example for description.

A working mode of the oscillator circuit in FIG. 5 in one cycle is similar to that in FIG. 3, and will not be repeated here.

Figure 6:
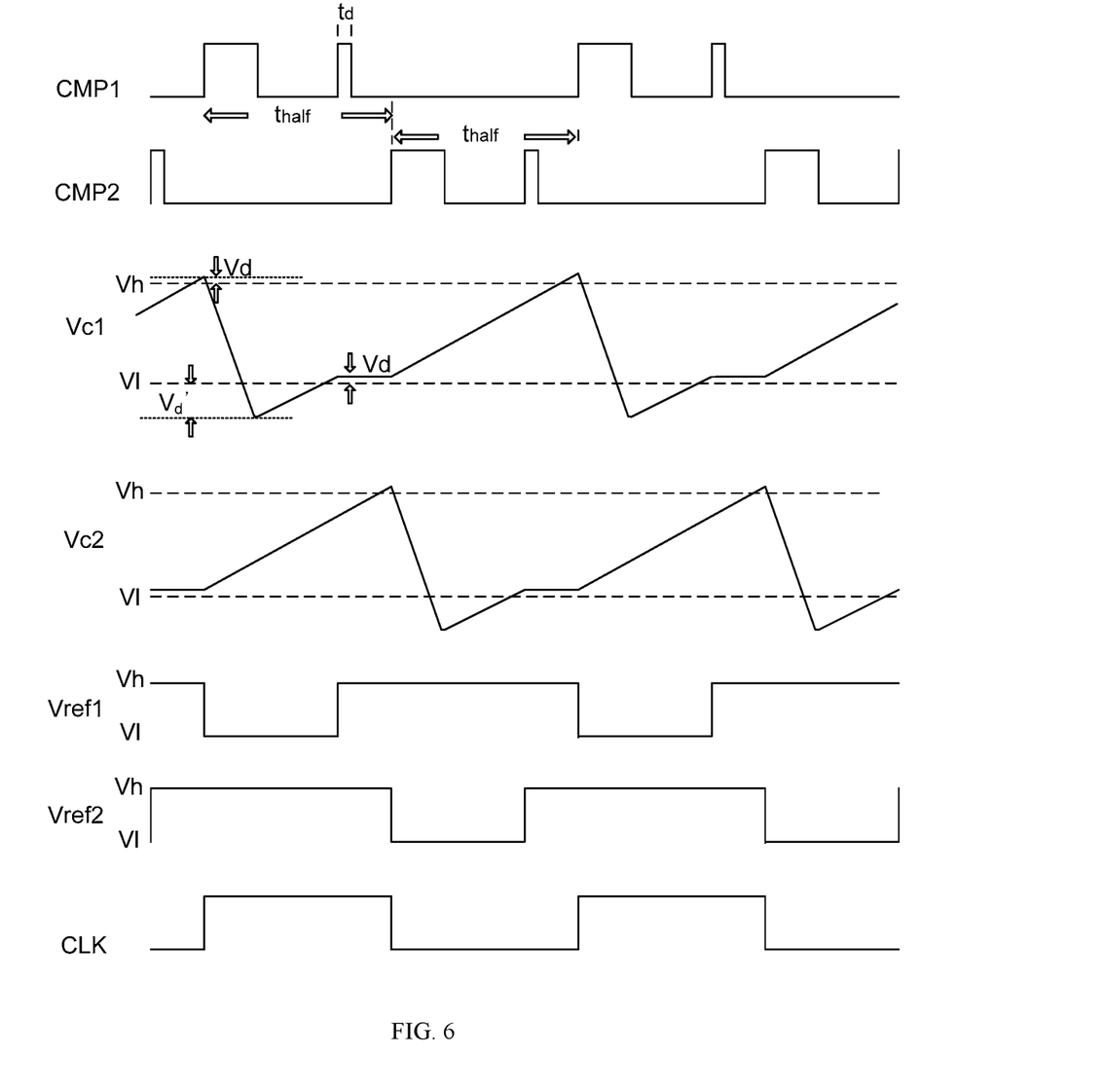
FIG. 6 is a timing diagram of the oscillator circuit in FIG. 5 according to the second embodiment of the present disclosure.

Referring to FIG. 6, which is a timing diagram of the oscillator circuit in FIG. 5, Vref1 represents a reference voltage of the first comparator CMP1, and Vref2 represents a reference voltage of the second comparator CMP2.

In this embodiment, in the case of C1=C2=C, a duty ratio of an output clock signal CLK of a logic control module 4 is 50%. It may be seen from the above that the duration of a half cycle is a duration in which the capacitor C1 or C2 is charged from the voltage $V_1+V_d$ to $V_h+V_d$, then the duration of the half cycle $T_{half}=T_{Vh}+T_d-(T_{V1}+T_d)=T_{Vh}-T_{V1}=(C*V_h)/I-(C*V)/I=C(V_h-V_1)/I$.

Herein, $T_{Vh}$ is a time in which the capacitor is charged from 0 to a first voltage $V_h$, $T_{V1}$ is a time in which the capacitor is charged from 0 to a second voltage $V_1$, I represents a discharge current of the current source in the charge and discharge circuit, and C represents a capacitance value of the capacitor C1 or C2.

It may be seen from the expression of Thaw that the cycle time of the oscillator circuit in this embodiment has nothing to do with the delay time T between the comparator and the logic control module 4, that is, an error source (i.e., the delay time T) that limits the accuracy of the oscillator circuit is eliminated, so that compared with the double capacitor oscillator circuit in FIG. 1, a higher accuracy may be achieved under the same current.

Compared with the first embodiment, this embodiment provides the oscillator circuit in which the current control module in the charge and discharge circuit is a current source.

A third embodiment of the present disclosure relates to an oscillator circuit. Compared with the first embodiment, q main difference of this embodiment is that, referring to FIG. 7, a reference voltage switching module 2 includes a reference voltage generating circuit 21 and a reference voltage control circuit 22.

Figure 7:
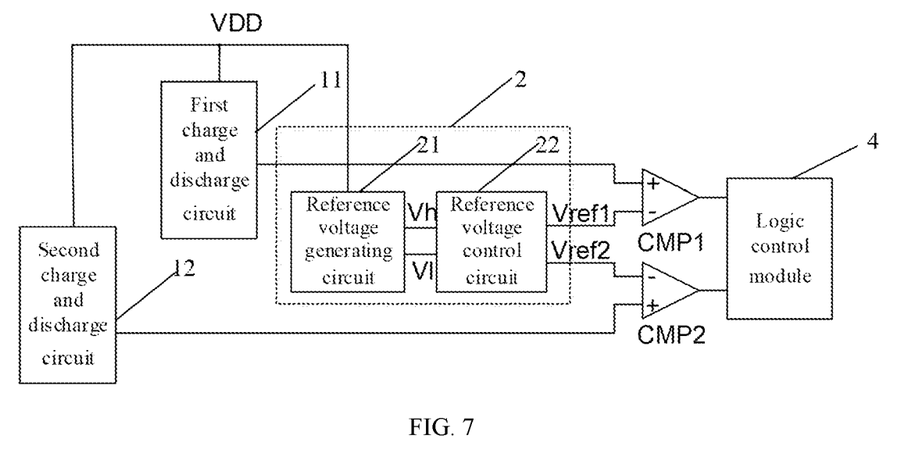
FIG. 7 is a circuit diagram of an oscillator circuit according to a third embodiment of the present disclosure.

Two output terminals of the reference voltage generating circuit 21 are respectively connected to two input terminals of the reference voltage control circuit 22. An input terminal of the reference voltage generating circuit 21 is connected to a voltage source VDD, and the reference voltage generating circuit 21 is also grounded to GND. Two output terminals of the reference voltage control circuit 22 are respectively connected to the second input terminals of two comparators, that is, the two output terminals of the reference voltage control circuit 22 are respectively connected to a negative input terminal of a first comparator CMP1 and a negative input terminal of a second comparator CMP2.

The reference voltage generating circuit 21 is configured to generate a first voltage $V_h$ and a second voltage $V_1$, and output the first voltage $V_h$ and the second voltage $V_1$ to the reference voltage control circuit 22.

A logic control module 4 is configured to control the reference voltage control circuit 22 to switch a reference voltage of each of the comparators.

Figure 8:
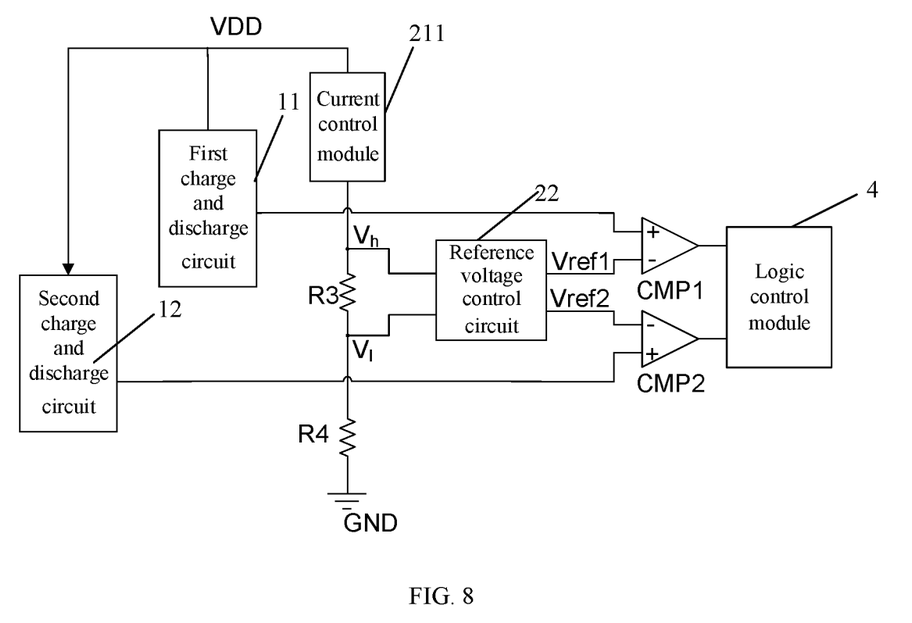
FIG. 8 is a circuit diagram of the oscillator circuit according to the third embodiment of the present disclosure, in which a reference voltage generating circuit includes a current control module, a first resistor and a second resistor.

In an example, referring to FIG. 8, the reference voltage generating circuit 21 includes a current control module 211, a first resistor R3 and a second resistor R4 connected in sequence.

A first terminal of the current control module 211 is configured to connect to the voltage source VDD, and a second terminal of the current control module 211 is connected to a first terminal of the first resistor R3. A second terminal of the first resistor R3 is connected to a first terminal of the second resistor R4, and a second terminal of the second resistor R4 is grounded.

The two terminals of the first resistor R3 form two output terminals of the reference voltage generating circuit 21, that is, the first terminal of the first resistor R3 outputs the first voltage $V_h$ to the reference voltage control circuit 22, and the second terminal of the first resistor R3 outputs the second voltage $V_1$ to the reference voltage control circuit 22.

In this embodiment, the current control module 211 may be a resistor or a current source.

Figure 9:
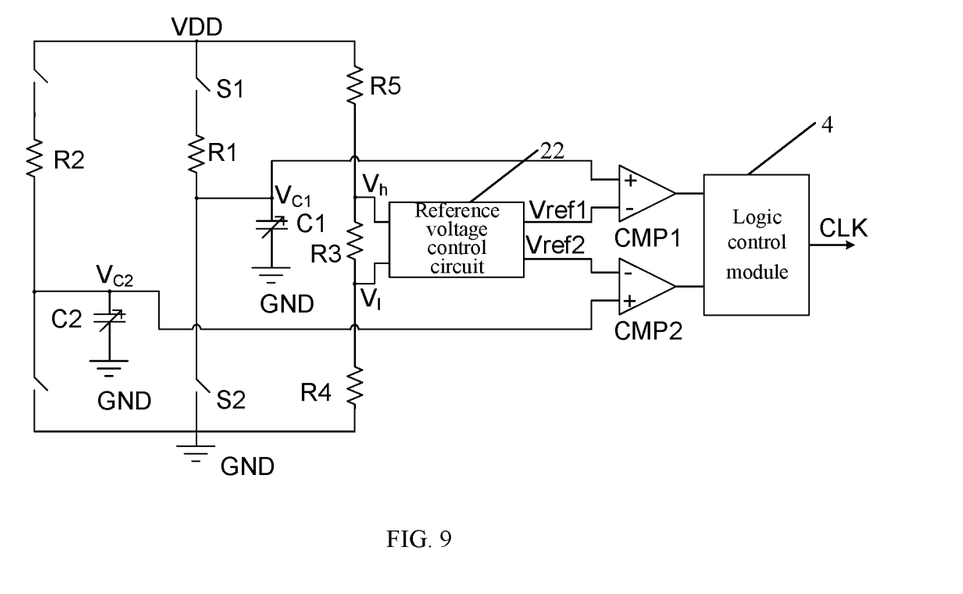
FIG. 9 is a circuit diagram of the oscillator circuit according to the third embodiment of the present disclosure, in which the current control module in FIG. 8 is a resistor.

Referring to FIG. 9, when the current control module 211 is a resistor R5, it may be known that both the first voltage $V_h$ and the second voltage $V_1$ are divided voltages of the voltage source VDD, so $V_h=K_1*VDD$, $V_1=K_2*VDD$, then $$T_{half} = RC * \ln\frac{VDD - V1}{VDD - Vh}$$

in the first embodiment may be simplified as:

$$T_{half} = RC * \ln\frac{1 - K2}{1 - K1}.$$

It may be seen that $T_{half}$ is a number independent of the VDD, so that a clock output frequency is independent of the voltage source and a bias current, and only related to parameters of R and C.

Figure 10:
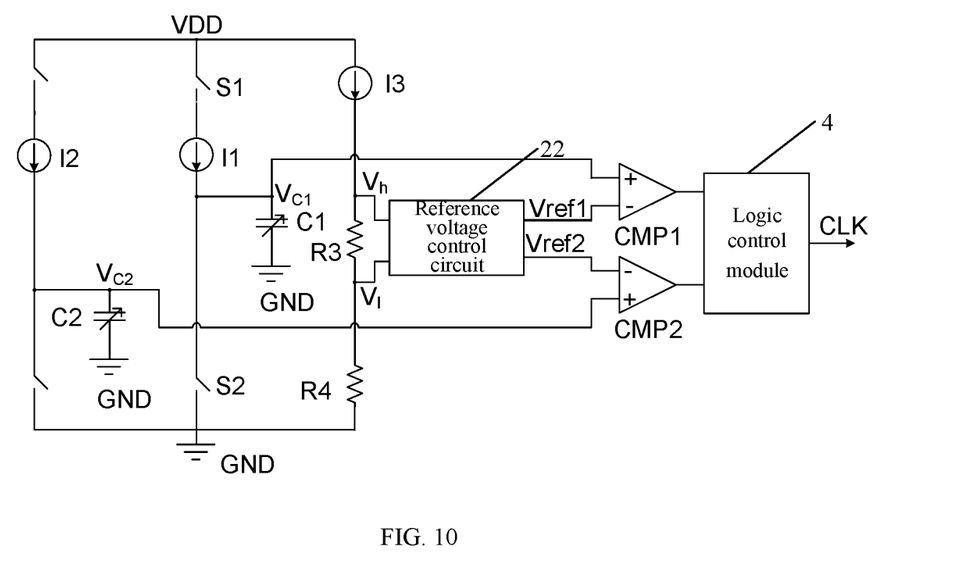
FIG. 10 is a circuit diagram of the oscillator circuit according to the third embodiment of the present disclosure, in which the current control module in FIG. 8 is a current source.

Referring to FIG. 10, when the current control module 211 is a current source I3, I' represents a current of the current source I3, then $V_h - V_1 = R3*I'$, and then $T_{half} = C(V_h - V_1)/I$ in the second embodiment may be simplified as: $T_{half} = C*R3*I'/I$. I'/I may be simplified to a constant N, then it may be seen that $T_{half} = C*R3*N$, which is convenient for controlling the current in the circuit, and the clock output frequency is only related to the parameters of R and C.

Compared with the first embodiment, this embodiment provides a specific implementation of the reference voltage switching module. It should be noted that this embodiment may also be used as an improvement on the basis of the second embodiment to achieve the same technical effect.

A fourth embodiment of the present disclosure relates to a chip, which includes the oscillator circuit.

A fifth embodiment of the present disclosure relates to an electronic device, which includes the chip of the fourth embodiment.

Those skilled in the art should appreciate that the above embodiments are specific examples for implementing the present disclosure. In practice, however, various changes may be made in the forms and details of the specific embodiments without departing from the spirit and scope of the present disclosure.

What is claimed is:

1. An oscillator circuit, comprising:
a first charge and discharge circuit, a second charge and discharge circuit, a reference voltage switching module, a first comparator, a second comparator and a logic control module; wherein:
the first charge and discharge circuit is connected to a first input terminal of the first comparator, the second charge and discharge circuit is connected to a first input terminal of the second comparator, the reference voltage switching module is connected to a second input terminal of the first comparator and to a second input terminal of the second comparator respectively, and an output terminal of the first comparator and an output terminal of the second comparator are respectively connected to the logic control module;
the logic control module is configured to control the first charge and discharge circuit to start discharging, control the second charge and discharge circuit to start charging, and control the reference voltage switching module to switch a reference voltage of the first comparator to a second voltage, when an output of the first comparator whose reference voltage is at a first voltage transitions; the logic control module is further configured to control the first charge and discharge circuit to start charging when the output of the first comparator transitions again;
the logic control module is further configured to control the reference voltage switching module to switch the reference voltage of the first comparator to the first voltage and control the first charge and discharge circuit to stop charging when the output of the first comparator transitions again;
the logic control module is further configured to control the second charge and discharge circuit to start discharging, control the first charge and discharge circuit to start charging and control the reference voltage switching module to switch a reference voltage of the second comparator to the second voltage when an output of the second comparator whose reference voltage is the first voltage transitions;
the logic control module is further configured to control the second charge and discharge circuit to start charging when the output of the second comparator transitions again; and
the logic control module is further configured to control the reference voltage switching module to switch the reference voltage of the second comparator to the first voltage and control the second charge and discharge circuit to stop charging when the output of the second comparator transitions again;
wherein the reference voltage switching module comprises: a reference voltage generating circuit and a reference voltage control circuit and wherein:
two output terminals of the reference voltage generating circuit are respectively connected to two input terminals of the reference voltage control circuit, and two output terminals of the reference voltage control circuit are respectively connected to the second input terminal of the first comparator and the second input terminal of the second comparator;
the reference voltage generating circuit is configured to generate the first voltage and the second voltage, and output the first voltage and the second voltage to the reference voltage control circuit; and
the logic control module is configured to control the reference voltage control circuit to switch the reference voltage of the first comparator and the reference voltage of the second comparator;
wherein the reference voltage generating circuit comprises: a current control module, a first resistor and a second resistor connected in sequence; and wherein:
a first terminal of the current control module is configured to connect to a voltage source, a second terminal of the current control module and a first terminal of the second resistor are respectively connected to two terminals of the first resistor, and a second terminal of the second resistor is grounded; and
the two terminals of the first resistor form the two output terminals of the reference voltage generating circuit.

2. The oscillator circuit according to claim 1, wherein the first charge and discharge circuit has the same structure as the second charge and discharge circuit, and each of the first charge and discharge circuit and the second charge and discharge circuit comprises: a current control module and a charging capacitor; and wherein:
a first terminal of the current control module is configured to connect to a voltage source, a second terminal of the current control module is connected to a first terminal of the charging capacitor, and a second terminal of the charging capacitor is grounded; and a connection between the current control module and the charging capacitor in the first charge and discharge circuit is connected to the first input terminal of the first comparator; and a connection between the current control module and the charging capacitor in the second charge and discharge circuit is connected to the first input terminal of the second comparator.

3. The oscillator circuit according to claim 2, wherein the current control module is a resistor or a current source.

4. The oscillator circuit according to claim 2, wherein each of the first charge and discharge circuit and the second charge and discharge circuit further comprises a first switch module and a second switch module; and wherein:

the first terminal of the current control module is configured to connect to the voltage source through the first switch module, the connection between the current control module and the charging capacitor in each of the first charge and discharge circuit and the second charge and discharge circuit is grounded through the second switch module, and the logic control module is configured to control the first switch module and the second switch module;

the logic control module is configured to control the charge and discharge circuit to start charging by controlling the first switch module in the charge and discharge circuit to be turned on and the second switch module to be turned off; and the logic control module is configured to control the charge and discharge circuit to start discharging by controlling the first switch module to be turned off and the second switch module to be turned on.

5. The oscillator circuit according to claim 2, wherein the logic control module is configured to control the first charge and discharge circuit and the second charge and discharge circuit to start charging respectively when the oscillator circuit starts working, and control the second charge and discharge circuit to stop charging when a voltage across two terminals of the charging capacitor in the second charge and discharge circuit reaches the first voltage.

6. The oscillator circuit according to claim 5, wherein a duration of one cycle of the oscillator circuit is twice a duration of charging the charging capacitor from the first voltage to the second voltage.

7. A chip, comprising an oscillator circuit, wherein the oscillator circuit comprises:

a first charge and discharge circuit, a second charge and discharge circuit, a reference voltage switching module, a first comparator, a second comparator and a logic control module; wherein:

the first charge and discharge circuit is connected to a first input terminal of the first comparator, the second charge and discharge circuit is connected to a first input terminal of the second comparator, the reference voltage switching module is connected to a second input terminal of the first comparator and a second input terminal of the second comparator respectively, and an output terminal of the first comparator and an output terminal of the second comparator are respectively connected to the logic control module;

the logic control module is configured to control the first charge and discharge circuit to start discharging when an output of the first comparator whose reference voltage is a first voltage transitions, and control the second charge and discharge circuit to start charging and control the reference voltage switching module to switch a reference voltage of the first comparator to a second voltage;

the logic control module is further configured to control the first charge and discharge circuit to start charging when the output of the first comparator transitions again;

the logic control module is further configured to control the reference voltage switching module to switch the reference voltage of the first comparator to the first voltage and control the first charge and discharge circuit to stop charging when the output of the first comparator transitions again;

the logic control module is further configured to control the second charge and discharge circuit to start discharging, control the first charge and discharge circuit to start charging and control the reference voltage switching module to switch a reference voltage of the second comparator to a second voltage when an output of the second comparator whose reference voltage is the first voltage transitions;

the logic control module is further configured to control the second charge and discharge circuit to start charging when the output of the second comparator transitions again; and the logic control module is further configured to control the reference voltage switching module to switch the reference voltage of the second comparator to the first voltage and control the second charge and discharge circuit to stop charging when the output of the second comparator transitions again;

wherein the reference voltage switching module comprises: a reference voltage generating circuit and a reference voltage control circuit and wherein:

two output terminals of the reference voltage generating circuit are respectively connected to two input terminals of the reference voltage control circuit, and two output terminals of the reference voltage control circuit are respectively connected to the second input terminal of the first comparator and the second input terminal of the second comparator;

the reference voltage generating circuit is configured to generate the first voltage and the second voltage, and output the first voltage and the second voltage to the reference voltage control circuit; and the logic control module is configured to control the reference voltage control circuit to switch the reference voltage of the first comparator and the reference voltage of the second comparator;

wherein the reference voltage generating circuit comprises: a current control module, a first resistor and a second resistor connected in sequence; and wherein:

a first terminal of the current control module is configured to connect to a voltage source, a second terminal of the current control module and a first terminal of the second resistor are respectively connected to two terminals of the first resistor, and a second terminal of the second resistor is grounded; and the two terminals of the first resistor form the two output terminals of the reference voltage generating circuit.

8. The chip according to claim 7, wherein the first charge and discharge circuit has the same structure as the second charge and discharge circuit, and each of the first charge and discharge circuit and the second charge and discharge circuit comprises: a current control module and a charging capacitor; and wherein:

a first terminal of the current control module is configured to connect to a voltage source, a second terminal of the current control module is connected to a first terminal of the charging capacitor, and a second terminal of the charging capacitor is grounded; and a connection between the current control module and the charging capacitor in the first charge and discharge circuit is connected to the first input terminal of the first comparator; and a connection between the current control module and the charging capacitor in the second charge and discharge circuit is connected to the first input terminal of the second comparator.

9. The chip according to claim 8, wherein the current control module is a resistor or a current source.

10. The chip according to claim 8, wherein each of the first charge and discharge circuit and the second charge and discharge circuit further comprises a first switch module and a second switch module; and wherein:

the first terminal of the current control module is configured to connect to the voltage source through the first switch module, the connection between the current control module and the charging capacitor in each of the first charge and discharge circuit and the second charge and discharge circuit is grounded through the second switch module, and the logic control module is configured to control the first switch module and the second switch module;

the logic control module is configured to control the charge and discharge circuit to start charging by controlling the first switch module in the charge and discharge circuit to be turned on and the second switch module to be turned off; and the logic control module is configured to control the charge and discharge circuit to start discharging by controlling the first switch module to be turned off and the second switch module to be turned on.

11. The chip according to claim 8, wherein the logic control module is configured to control the first charge and discharge circuit and the second charge and discharge circuit to start charging respectively when the oscillator circuit starts working, and control the second charge and discharge circuit to stop charging when a voltage across two terminals of the charging capacitor in the second charge and discharge circuit reaches the first voltage.

12. The chip according to claim 8, wherein a duration of one cycle of the oscillator circuit is twice a duration of charging the charging capacitor from the first voltage to the second voltage.

13. An electronic device, comprising a chip including an oscillator circuit wherein the oscillator circuit comprises:

a first charge and discharge circuit, a second charge and discharge circuit, a reference voltage switching module, a first comparator, a second comparator and a logic control module; wherein:

the first charge and discharge circuit is connected to a first input terminal of the first comparator, the second charge and discharge circuit is connected to a first input terminal of the second comparator, the reference voltage switching module is connected to a second input terminal of the first comparator and a second input terminal of the second comparator respectively, and an output terminal of the first comparator and an output terminal of the second comparator are respectively connected to the logic control module;

the logic control module is configured to control the first charge and discharge circuit to start discharging when an output of the first comparator whose reference voltage is a first voltage transitions, and control the second charge and discharge circuit to start charging and control the reference voltage switching module to switch a reference voltage of the first comparator to a second voltage;

the logic control module is further configured to control the first charge and discharge circuit to start charging when the output of the first comparator transitions again;

the logic control module is further configured to control the reference voltage switching module to switch the reference voltage of the first comparator to the first voltage and control the first charge and discharge circuit to stop charging when the output of the first comparator transitions again;

the logic control module is further configured to control the second charge and discharge circuit to start discharging, control the first charge and discharge circuit to start charging and control the reference voltage switching module to switch a reference voltage of the second comparator to a second voltage when an output of the second comparator whose reference voltage is the first voltage transitions;

the logic control module is further configured to control the second charge and discharge circuit to start charging when the output of the second comparator transitions again; and the logic control module is further configured to control the reference voltage switching module to switch the reference voltage of the second comparator to the first voltage and control the second charge and discharge circuit to stop charging when the output of the second comparator transitions again;

wherein the reference voltage switching module comprises: a reference voltage generating circuit and a reference voltage control circuit and wherein:

two output terminals of the reference voltage generating circuit are respectively connected to two input terminals of the reference voltage control circuit, and two output terminals of the reference voltage control circuit are respectively connected to the second input terminal of the first comparator and the second input terminal of the second comparator;

the reference voltage generating circuit is configured to generate the first voltage and the second voltage, and output the first voltage and the second voltage to the reference voltage control circuit; and the logic control module is configured to control the reference voltage control circuit to switch the reference voltage of the first comparator and the reference voltage of the second comparator;

wherein the reference voltage generating circuit comprises: a current control module, a first resistor and a second resistor connected in sequence; and wherein:

a first terminal of the current control module is configured to connect to a voltage source, a second terminal of the current control module and a first terminal of the second resistor are respectively connected to two terminals of the first resistor, and a second terminal of the second resistor is grounded; and the two terminals of the first resistor form the two output terminals of the reference voltage generating circuit.

14. The electronic device according to claim 13, wherein the first charge and discharge circuit has the same structure as the second charge and discharge circuit, and each of the first charge and discharge circuit and the second charge and discharge circuit comprises: a current control module and a charging capacitor; and wherein:
- a first terminal of the current control module is configured to connect to a voltage source, a second terminal of the current control module is connected to a first terminal of the charging capacitor, and a second terminal of the charging capacitor is grounded; and
- a connection between the current control module and the charging capacitor in the first charge and discharge circuit is connected to the first input terminal of the first comparator; and a connection between the current control module and the charging capacitor in the second charge and discharge circuit is connected to the first input terminal of the second comparator.

15. The electronic device according to claim 14, wherein the current control module is a resistor or a current source.

16. The electronic device according to claim 14, wherein each of the first charge and discharge circuit and the second charge and discharge circuit further comprises a first switch module and a second switch module; and wherein:
- the first terminal of the current control module is configured to connect to the voltage source through the first switch module, the connection between the current control module and the charging capacitor in each of the first charge and discharge circuit and the second charge and discharge circuit is grounded through the second switch module, and the logic control module is configured to control the first switch module and the second switch module;
- the logic control module is configured to control the charge and discharge circuit to start charging by controlling the first switch module in the charge and discharge circuit to be turned on and the second switch module to be turned off; and
- the logic control module is configured to control the charge and discharge circuit to start discharging by controlling the first switch module to be turned off and the second switch module to be turned on.

17. The electronic device according to claim 14, wherein the logic control module is configured to control the first charge and discharge circuit and the second charge and discharge circuit to start charging respectively when the oscillator circuit starts working, and control the second charge and discharge circuit to stop charging when a voltage across two terminals of the charging capacitor in the second charge and discharge circuit reaches the first voltage.

* * * * *